United States Patent
Aksu et al.

(10) Patent No.: US 8,153,469 B2
(45) Date of Patent: Apr. 10, 2012

(54) REACTION METHODS TO FORM GROUP IBIIIAVIA THIN FILM SOLAR CELL ABSORBERS

(75) Inventors: Serdar Aksu, San Jose, CA (US); Yuriy Matus, Pleasanton, CA (US); Rasmi Das, Sunnyvale, CA (US); Mustafa Pinarbasi, Morgan Hill, CA (US)

(73) Assignee: SoloPower, Inc., San Jose, CA (US)

( * ) Notice: Subject to any disclaimer, the term of this patent is extended or adjusted under 35 U.S.C. 154(b) by 0 days.

(21) Appl. No.: 12/632,617

(22) Filed: Dec. 7, 2009

(65) Prior Publication Data

US 2011/0136293 A1    Jun. 9, 2011

(51) Int. Cl.
  *H01L 21/00* (2006.01)
(52) U.S. Cl. .................................. 438/84; 257/E21.09
(58) Field of Classification Search ............. 438/94
  See application file for complete search history.

(56) References Cited

U.S. PATENT DOCUMENTS

| | | | | |
|---|---|---|---|---|
| 5,578,503 | A | 11/1996 | Karg et al. | 438/95 |
| 5,674,555 | A | 10/1997 | Birkmire et al. | 427/76 |
| 6,429,369 | B1 | 8/2002 | Tober et al. | 136/265 |
| 6,518,086 | B2 | 2/2003 | Beck et al. | 438/95 |
| 2007/0111367 | A1* | 5/2007 | Basol | 438/95 |
| 2007/0163643 | A1* | 7/2007 | Van Duren et al. | 136/262 |
| 2008/0210295 | A1* | 9/2008 | Basol | 136/252 |
| 2008/0280030 | A1* | 11/2008 | Van Duren et al. | 427/74 |
| 2009/0130796 | A1 | 5/2009 | Taunier et al. | |

OTHER PUBLICATIONS

Mooney et al., "The formation of CuInSe2 thin films by rapid thermal processing", Solar Cells, vol. 30, p. 69-77, 1991.
Kerr et al., "Rapid Thermal Processing of CIS Precursors", IEEE Photovoltaics Specialist Conf., p. 676-679, 2002.
Gabor et al., "CuInSe2 Thin Film Formation by Rapid Annealing of the Elemental Precursor", AIP Conf. Proc. #268, PV Advanced Research & Development Project, p. 236-242, 1992.

* cited by examiner

*Primary Examiner* — Thao Le
*Assistant Examiner* — Kimberly Trice
(74) *Attorney, Agent, or Firm* — Pillsbury Winthrop Shaw Pittman LLP

(57) ABSTRACT

The present invention provides a method to form Group IBIIIAVIA solar cell absorber layers on continuous flexible substrates. In a preferred aspect, the method forms a Group IBIIIAVIA absorber layer for manufacturing photovoltaic cells by providing a workpiece having a precursor layer formed over a substrate, the precursor layer including copper, indium, gallium and selenium; heating the precursor layer to a first temperature; reacting the precursor layer at the first temperature for a first predetermined time to transform the precursor layer to a partially formed absorber structure; cooling down the partially formed absorber structure to a second temperature, wherein both the first temperature and the second temperature are above 400° C.; and reacting the partially formed absorber structure at the second temperature for a second predetermined time, which is longer than the first predetermined time, to form a Group IBIIIAVIA absorber layer.

13 Claims, 2 Drawing Sheets

REACTION METHODS TO FORM GROUP IBIIIAVIA THIN FILM SOLAR CELL ABSORBERS

BACKGROUND OF THE INVENTION

1. Field of the Invention

The present invention relates to method and apparatus for preparing high quality thin films of semiconductor materials for radiation detector and photovoltaic device applications.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of the solar cells for terrestrial use. One way of reducing the cost of solar cells is to use compound semiconductor materials with high absorption coefficient and to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20% in laboratory scale. Absorbers containing Group IIIA element Al and/or Group VIA element Te also showed promise. Therefore, in summary, compounds containing; i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13, which is previously deposited on the substrate 11 and which acts as the electrical contact to the device. The substrate 11 and the conductive layer 13 form a base 20. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, (CdZn)S, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA components in the composition. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Sc/(Se+S) molar ratio varying from 0 to 1.

One technique for growing $Cu(In,Ga)(S,Se)_2$ type compound thin films for solar cell applications is a two-stage process where metallic components of the $Cu(In,Ga)(S,Se)_2$ material are first deposited onto a substrate, and then reacted with S and/or Se in a high temperature annealing process. For example, for $CuInSe_2$ growth, thin layers of Cu and In are first deposited on a substrate and then this stacked precursor layer is reacted with Se at elevated temperature. If the reaction atmosphere also contains sulfur, then a $CuIn(S,Se)_2$ layer can be grown. Addition of Ga in the precursor layer, i.e. use of a Cu/In/Ga stacked film precursor, allows the growth of a $Cu(In,Ga)(S,Se)_2$ absorber.

Two-stage process approach may also employ stacked layers comprising Group VIA materials. For example, a $Cu(In,Ga)Se_2$ film may be obtained by depositing In—Ga—Se and Cu—Se layers in an In—Ga—Se/Cu—Se stack and reacting them in presence of Se. Similarly, stacks comprising Group VIA materials and metallic components may also be used. Stacks comprising Group VIA materials include, but are not limited to In—Ga—Se/Cu stack, Cu/In/Ga/Se stack, Cu/Se/In/Ga/Se stack, etc.

Selenization and/or sulfidation or sulfurization of precursor layers comprising metallic components may be carried out in various forms of Group VIA material(s). One approach involves using gases such as $H_2Se$, $H_2S$ or their mixtures to react, either simultaneously or consecutively, with the precursor comprising Cu, In and/or Ga. This way a $Cu(In,Ga)(S,Se)_2$ film may be formed after annealing and reacting at elevated temperatures. It is possible to increase the reaction rate or reactivity by using a faster ramp rate in the reactive gas atmosphere during the crystallization process or compound formation. Se vapors or S vapors from elemental sources may also be used for selenization and sulfidation. Alternately, as described before, Se and/or S may be deposited over the precursor layer comprising Cu, In and/or Ga and the stacked structure can be annealed at elevated temperatures to initiate reaction between the metallic elements or components and the Group VIA material(s) to form the $Cu(In,Ga)(S,Se)_2$ compound.

Reaction step in a two-stage process is typically carried out in batch furnaces. In this approach, a number of pre-cut substrates, typically glass substrates, with precursor layers deposited on them are placed into a batch furnace and reaction is carried out for periods that may range from 15 minutes to several hours. Temperature of the furnace is typically raised to the reaction temperature, which may be in the range of 400-600° C., after loading the substrates. The ramp rate for this temperature rise is normally lower than 5° C./sec, typically less than 1° C./sec. This slow heating process works for selenizing metallic precursors (such as precursor layers containing only Cu, In and/or Ga) using gaseous Se sources such as $H_2Se$ or organometallic Se sources. For precursors containing solid Se, however, slow ramp rate causes Se de-wetting and morphological problems. For example, reacting a precursor layer with a structure of base/Cu/In/Se by placing it in a batch furnace with a low temperature ramp rate (such as 1-3° C./sec) yields films that are powdery and having non-uniform grains with extremely rough surface morphology. Such films would not yield high efficiency solar cell absorbers.

One prior art method described in U.S. Pat. No. 5,578,503 utilizes a rapid thermal annealing (RTP) approach to react the precursor layers in a batch manner, one substrate at a time. Such RTP approaches are also disclosed in various publications (see, for example, Mooney et al., Solar Cells, vol: 30, p: 69, 1991, Gabor et al., AIP Conf. Proc. #268, PV Advanced Research & Development Project, p: 236, 1992, and Kerr et al., IEEE Photovoltaics Specialist Conf., p: 676, 2002). In the prior art RTP reactor design the temperature of the substrate with the precursor layer is raised to the reaction temperature at a high rate, typically at 10° C./sec. It is believed that such high temperature rise through the melting point of Se (220° C.) avoids the problem of de-wetting and thus yields films with good morphology.

From the foregoing, there is a need for new methods and apparatus to carry out reaction of precursor layers to manufacture high efficiency CIGS(S) type absorber layers.

SUMMARY

The present invention provides a method to form Group IBIIIAVIA solar cell absorber layers on continuous flexible substrates.

In a preferred aspect, the method forms a Group IBIIIAVIA absorber layer for manufacturing photovoltaic cells by providing a workpiece having a precursor layer formed over a substrate, the precursor layer including copper, indium, gallium and selenium; heating the precursor layer to a first temperature; reacting the precursor layer at the first temperature for a first predetermined time to transform the precursor layer to a partially formed absorber structure; cooling down the partially formed absorber structure to a second temperature, wherein both the first temperature and the second temperature are above 400° C.; and reacting the partially formed absorber structure at the second temperature for a second predetermined time, which is longer than the first predetermined time, to form a Group IBIIIAVIA absorber layer.

DETAILED DESCRIPTION

The present invention provides a method for forming a high quality Group IBIIIAVIA compound semiconductor layer or absorber that can be used for high efficiency thin film solar cell fabrication. In one embodiment, a precursor of the absorber is initially formed and then reacted using the heat treatment or the reaction process of the present invention to form a CIGS absorber layer. The precursor may be made of a single layer or a stack of materials comprising at least one Group IB material and at least one Group IIIA material, preferably in substantially un-reacted metallic form. The precursor may additionally contain Group VIA materials. The precursor may be deposited by a variety of methods including, but not limited to electrodeposition, screen printing, various ink and/or slurry deposition approaches such as doctor-blading, gravure coating, roll coating, or the like. There may be additional deposition process steps to add other ingredients such as dopants to the precursor to form a final precursor layer. Next, the precursor is subjected to the heat treatment or reaction process of the present invention including at least two distinct reaction steps. At a first reaction step of the present invention, the precursor may preferably be reacted when maintained at a temperature above 500° C. for a relatively short time for example 1-10 minutes, preferably 2-7 minutes. In the second step, the partially reacted precursor is cooled down to within a lower temperature range of 400-600° C., and reaction is continued in an inert atmosphere for a longer time for example 10-40 minutes, preferably 15-25 minutes. Thus, the temperature of the workpiece during both the first reaction step and the second reaction step is above 400° C. An exemplary method of the present invention will now be performed to form a $Cu(In,Ga)Se_2$ or CIGS solar cell absorber layer on a base. It will be appreciated that the invention is also applicable to the formation of other Group IBIIIAVIA compound films or absorbers comprising other Group IB materials such as Ag, other Group IIIA materials such as Al and Tl, and other Group VIA materials such as S and Te. It should be noted that the base over which the precursor is formed may include a rigid or a flexible substrate. In an embodiment where the base includes a flexible substrate and a contact layer thereover, the combination of the base and a precursor formed over the contact layer can be together referred to as a flexible workpiece or workpiece. If the flexible workpiece is made for a roll to roll process, it can be called continuous flexible workpiece or continuous workpiece. A continuous workpiece may have a length of 10-5000 meters or more.

Figure 1:
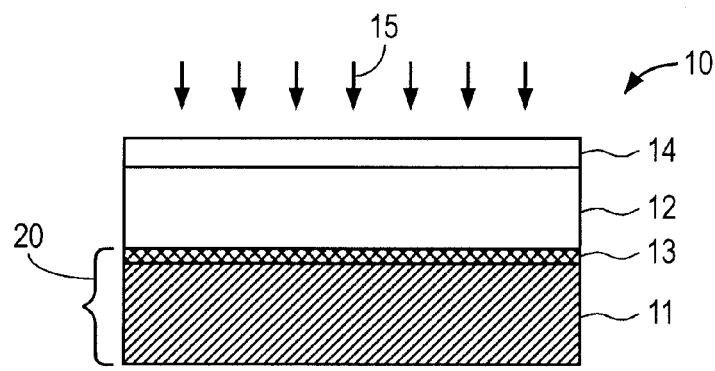
FIG. 1 is a cross-sectional view of a solar cell employing a Group IBIIIAVIA absorber layer.
Figure 2:
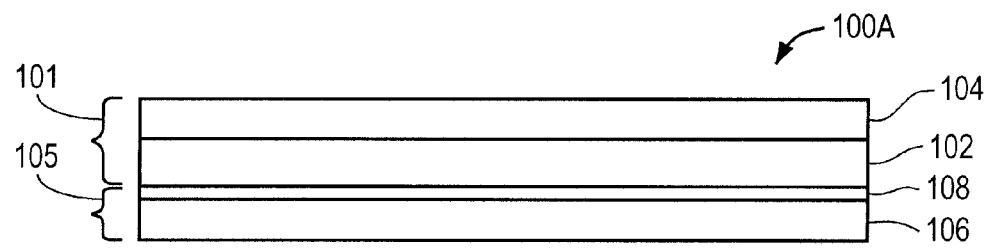
FIG. 2 is a schematic view of a workpiece including a precursor structure formed on a base.

FIG. 2 show an exemplary workpiece 100A to use in a reaction process of the present invention. The workpiece 100A generally includes precursor layer structure 101 formed over a base 105 that has a substrate 106 and a contact layer 108. The precursor structure 101 may comprise a first precursor layer 102 formed over the contact layer 108 and optionally a second precursor layer 104 formed over the first precursor layer 102. The first precursor layer 102 in this example may for example be a substantially metallic layer from a combination of the Group IB materials (such as Cu) and the Group IIIA materials (such as In and Ga) are metals. Alternatively, in addition to the Group IB and IIIA materials, the first precursor layer 102 may include Group VIA materials which are either semi-metals (such as Se and Te) or non-metals (such as S). Therefore, the first precursor layer 102 may be substantially metallic comprising Group IB and Group IIIA metals, and optionally a Group VIA material.

Accordingly, the first precursor layer 102 includes at least Cu and one of In and Ga. Preferably, the first precursor layer 102 includes all of Cu, In, Ga, and optionally Se in any possible order or combination. For example, the first precursor layer 102 may be a stack of a Cu-rich film and an In and/or Ga rich film and optionally a Se film. Various techniques may be used to deposit the first precursor layer 102 over the base 105. Although the preferred deposition technique for the present invention is electrodeposition, other techniques including, but are not limited to, evaporation, sputtering, ink deposition and electrodeposition may also be used. It should be noted that the configuration of the first precursor structure 102 may be changed widely and it is in the scope of this invention. For example, the first precursor layer 102 may be a single Cu—In—Ga film, or a stack of multiple films such as a Cu/In/Ga stack, a Cu/Ga/In stack, a Cu—In/Ga stack, a Cu—Ga/In stack, a Cu/In—Ga stack and the like, where Cu—In, Cu—Ga, In—Ga and Cu—In—Ga refer to mixtures or alloys of Cu and In, Cu and Ga, In and Ga, and Cu, In and Ga respectively. Se may be added to these stacks or films in various ways either, for example as a Cu, In or Ga and Se compound films, or as a single Se film. A dopant such as Na may also be included in the first precursor layer 102. The average thickness of the first precursor layer 102 may be in the range of 400-1000 nm. The second precursor layer 104 includes a Group VIA-rich material portion such as a Se-rich layer or a pure Se layer deposited on the first precursor layer 102. The substrate 106 of the workpiece 100A may be a metallic or polymeric substrate, preferably a 25-75 micrometer thick flexible metallic foil such as a stainless steel foil or an aluminum alloy foil or a high temperature flexible polymeric material foil such as an electrically insulating polyimide web. The contact layer 108 is a conductive layer comprising a material that makes ohmic contact to Group IBIIIAVIA compounds. Such materials include but are not limited to Mo, W, Ta, and their nitrides and materials such as Ru, Ir and Os.

Figure 3:
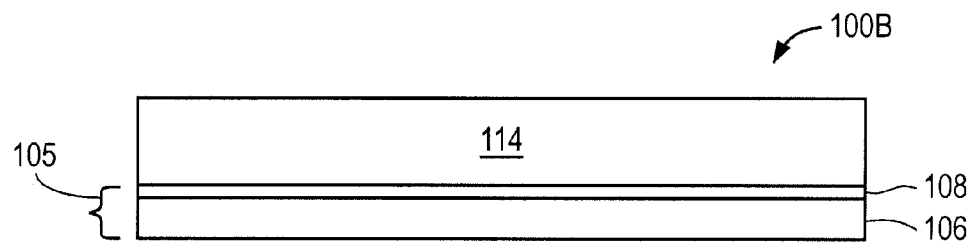
FIG. 3 is a schematic view of the workpiece shown in FIG. 2 wherein the precursor structure has been transformed into an absorber layer.

As will be described below, the precursor structure 101 of the workpiece 100A is reacted using a reaction process of the present invention to transform the precursor structure 101 into a CIGS absorber. As shown in FIG. 3, the reaction process transforms the precursor structure 101 into a Group IBIIIAVIA absorber layer 114 or absorber layer. The workpiece with the absorber layer 114 will be called processed workpiece 100B hereinafter.

In this embodiment, the reaction process of the precursor structure 101 may be performed at two successive steps. In general, a first reaction step partially reacts the precursor structure 101 at a high temperature to form a partially crystallized absorber, and a second reaction step fully transforms the partially reacted precursor or partially crystallized absorber into the absorber layer 114 at a temperature that is lower than or equal to the temperature of the first reaction step. At the first reaction step, the temperature of the workpiece 100A is increased from room temperature to a temperature range of about 500-700° C. while exposing it to an inert or Group VIA material containing atmosphere. The first reaction step is terminated by cooling down the section of the workpiece 100A to a temperature range of the second reaction step of 400-600° C. while selenium vapor is removed from the reactor. At the second reaction step, reaction process of the precursor structure 101 is continued in an inert atmosphere for a relatively longer time until the absorber layer 114 fully forms. When the precursor layer 101 is subjected to high temperature, and in some cases to gaseous species comprising Group VIA materials, Cu, In and Ga species react with each other and with the Group VIA material(s) and form first, intermetallic compounds and metal alloys (for example, $CuIn_2$, $CuGa_2$, $Cu(In,Ga)_2$, $Cu_{11}In_9$, $Cu_{11}(In,Ga)_9$, etc.) and binary or ternary selenide (or sulfide if sulfur is present) species (for example, various In—Se, Cu—Se, In—Ga—Se and Ga—Se alloys) and then eventually these metallic compounds and alloys further react with the binary selenides or sulfides and with the Group VIA materials forming the Group IBIIIAVIA compound layer which is the absorber layer 114.

The reaction process of the present invention may be performed in a single reactor or in more than one reactors to process a workpiece or a section of a workpiece or a continuous workpiece. In a single reactor, the workpiece a section of the workpiece is placed into the reactor, and the above described reaction steps are carried out. When more than one reactor is used, the first reaction step may be carried out in a first reactor and the second reaction step in a second reactor. In this configuration, after the first step, the workpiece is taken out of the first reactor to cool it down to a desired low temperature, or the temperature of the second reaction step. After the cooling, the workpiece is placed into the second reactor and the second reaction step is carried out. A roll to roll reaction process using a single reactor will be described below.

Figure 4:
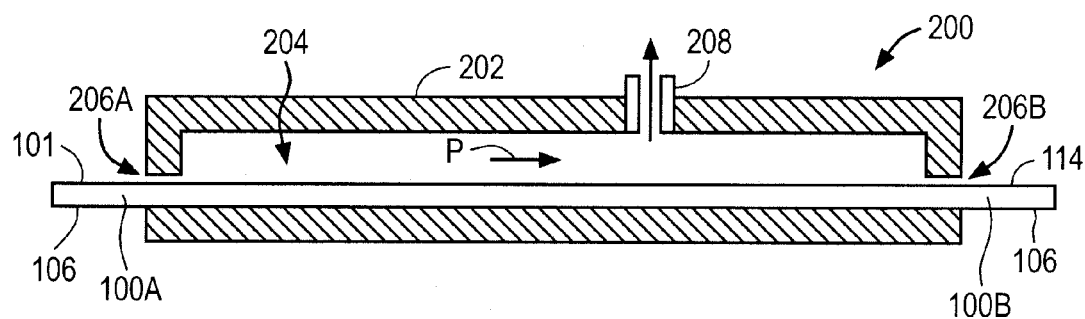
FIG. 4 is schematic view of a reactor.

FIG. 4 shows a side view of an exemplary roll to roll reactor 200 to process the workpiece 100A shown in FIG. 2. For the roll to roll process, the workpiece 100A may be a continuous flexible workpiece. The reactor 200 includes peripheral reactor walls 202 and a process gap 204 defined by the peripheral reactor walls 202. The workpiece 100A enters the reactor, reacted and leaves the reactor as the processed workpiece 100B. During the process, the workpiece 100A having the precursor structure 101 formed over the substrate 106 is advanced through the process gap 204 with a certain speed (1-5 ft/min) in a process direction 'P' to perform the reaction process of the present invention. When advanced into the process gap 204, the workpiece 100A is fed into the process gap 204 through an entrance opening 206A and exits the process gap 204 through an exit opening 206B as the processed workpiece 100B. Sections of the workpiece 100A entering the process gap 204 may be unwrapped from a supply spool (not shown) and sections of the processed workpiece 100B exiting the process gap 204 may be taken up and wound around a receiving spool (not shown), or other further processing may be performed on the processed portions.

During the process, inert gases such as nitrogen may be flowed into the process gap 204 through the entrance opening 206A and exit opening 206B and optionally through a gas inlet (not shown) connected to the process gap 204. Used gases may be removed from the process gap 204 through an exhaust opening 208 or other openings (not shown). Although the process gap 204 shown in FIG. 4 has a constant height, the height of the process gap 204 may be varied between the entrance opening 206A and the exit opening 206B. Details of an exemplary reactor for the formation of CIGS(S) type absorber layers on continuous workpieces can be for example found in the following patent application of the assignee of the present invention, application Ser. No. 12/334,420 filed on Dec. 12, 2008 entitled Reactor to Form Solar Cell Absorbers, which is incorporated herein by reference in its entirety.

Figure 5:
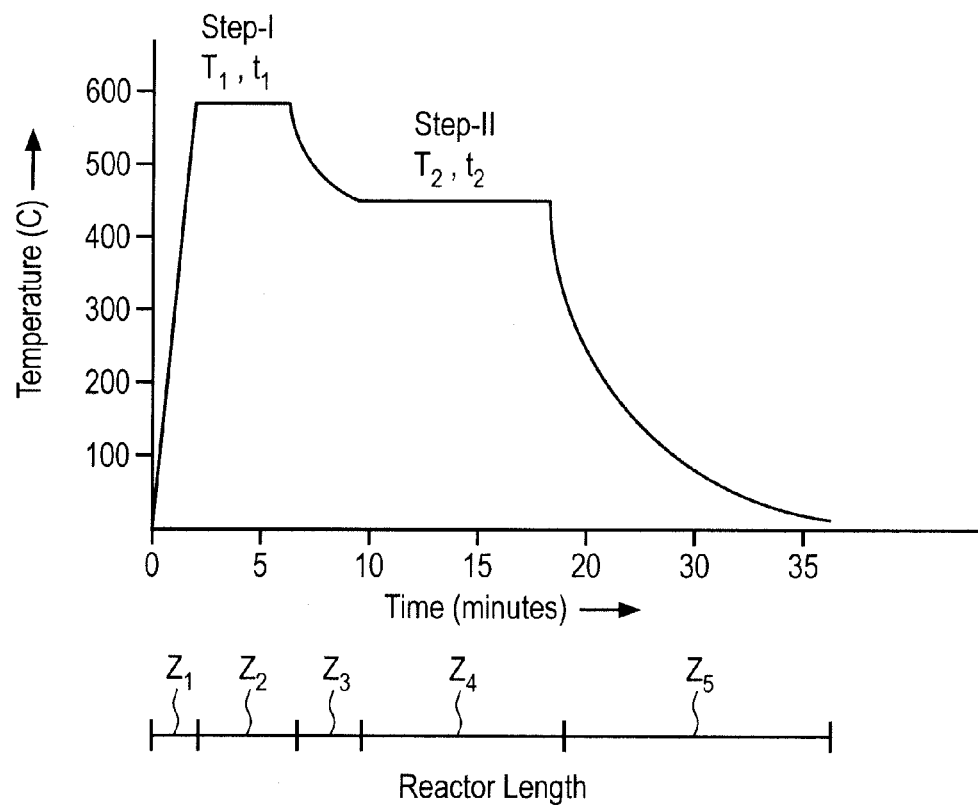
FIG. 5 is a time-temperature graph of an embodiment of a reaction process of the present invention.

FIG. 5 shows an exemplary temperature-time graph for a reaction performed in the reactor 200 in a roll to roll manner as the workpiece 100A is advanced through the process gap 294 of the reactor 200. The line below the time-temperature graph shows the length of the process gap and exemplary zones, namely, a first zone $Z_1$, a second zone $Z_2$, a third zone $Z_3$, a fourth zone $Z_4$ and a fifth zone $Z_5$. Referring to FIGS. 4 and 5, as a section of the workpiece is advanced into the reactor 200 and into the first zone $Z_1$ towards the second zone $Z_2$, the section of the workpiece 100A is heated up to a first temperature $T_1$ ($T_1$ temperature) with a ramp rate of at least 5° C./second. The first reaction step is performed at the second zone $Z_2$. As the section of the workpiece is advanced through the second zone $Z_2$ at the $T_1$ temperature, the precursor structure is reacted. The $T_1$ temperature may be in the range of 500-700° C., preferably 525-650° C. During the first reaction, the section of the workpiece 100A is maintained at the $T_1$ temperature for a first period $t_1$ ($t_1$ period). The $t_1$ period is in the range of 1-10 minutes, preferably 2-7 minutes. After the first reaction step, the section of the workpiece is advanced into the third zone $Z_3$ where the temperature of the section, and thus the workpiece, is ramped down or cooled from the $T_1$ temperature of the first reaction step to a second temperature $T_2$ ($T_2$ temperature) of the second reaction step. During the ramp-down, selenium vapor is removed from the third zone $Z_3$ and replaced with an inert gas such as nitrogen. The second reaction step is performed in an inert gas atmosphere in the fourth zone $Z_4$ of the reactor 200.

Due to the higher thermal energy, the first reaction step promotes a rapid reaction between metallic components of precursor structure 101 and selenium. In this step, metallic elements such as Cu, In, Ga react with Se at a fast rate to form a partially crystallized CIGS absorber layer. The high temperature in the first reaction step provides a high partial pressure for Se to form selenide compounds with metals of the precursor structure more readily. Higher thermal input of the first reaction step ensures both high diffusion rates and reaction rates during crystallization of the precursor structure. Due to the higher activities of species involved and their uniform intermixing at these high temperature, the first step of the reaction process is expect to produce a partially crystallized CIGS absorber layer, which is rich in quaternary selenide alloys such as $Cu(In,Ga)Se_2$. The desirable conditions such as high activity of selenium, high diffusion and reaction rates forces Ga to participate in the crystallization reaction. This minimizes segregation of Ga towards to back contact. However, the duration of the first reaction step, $t_1$, is not long enough to convert the entire precursor structure to a well-crystallized quaternary CIGS absorber layer. After the first reaction step, the precursor structure may partially contain ternary selenide alloys such as $CuInSe_2$, $CuGaSe_2$, or even binary selenides such as gallium selenide, copper selenide, and indium selenide. The duration of first reaction step is maintained only for a relatively short period to avoid the possibility of deformation of substrate material and to prevent diffusion of elemental species from the base or substrate surface, which might degrade the crystalline quality of the absorber. For example, when glass substrates are used, shortening the duration of the first reaction step ensures minimal softening of the glass substrate material. When a metallic substrate such as stainless steel is used, limited duration in the first reaction step minimizes diffusion of iron and chromium through the back contact into CIGS layer. The short duration also helps curtailing excess Se to diffuse through the back contact and form deleterious iron or chromium selenide. These selenide phases are highly conductive and might cause short-circuits in the solar cell reducing its efficiency.

As mentioned above, at the end of the first reaction step, the $T_1$ temperature is reduced to the $T_2$ temperature of the second reaction step and the unreacted selenium vapor is exhausted out from the third zone $Z_3$. The reason for exhausting the excess Se vapor is to limit the unwanted selenization reactions in the second reaction step. These deleterious reactions due to excess selenium activity include selenization of the contact layer as in the form of excess $MoSe_2$, and iron and chromium selenide formation when a stainless foil is used as a substrate.

Referring back to FIGS. 4 and 5, the second reaction step is performed maintaining the workpiece at the $T_2$ temperature in an inert gas atmosphere as the section of the workpiece 100A is advanced through the fourth zone $Z_4$. The $T_2$ temperature may be less than or equal to the $T_1$ temperature. The $T_2$ temperature may be in the range of 400-600° C., preferably 450-525° C. The section of the workpiece 100A is maintained at the $T_2$ temperature for a second period $t_2$ ($t_2$ period). The $t_2$ period is in the range of 10-40 minutes, preferably 15-25 minutes. The second reaction step fully transforms the partial absorber structure into absorber layer 114. After the second reaction step, the section of the workpiece is advanced into the fifth zone $Z_5$ where the temperature of the section is ramped down from the $T_2$ temperature to room temperature. The section of the workpiece 100A is cooled down to room temperature and taken out of the reactor as the processed workpiece 100B with the absorber layer 114. The formation of absorber layer 114 is completed during the second reaction step. During the cooling steps, a constant flow of nitrogen may be directed to the cooled section of the workpiece. At the second reaction step, the reaction continues with minimizing any binary or ternary phases but making all components to get integrated into CIGS phase. The second reaction step, which is carried out at relatively a lower temperature has a significant contribution to form a high crystalline quality absorber layer. First, it completes the phase formation of quaternary CIGS films from binary and ternary selenides as well as any species that are not fully reacted in the first step. Secondly, annealing at the $T_2$ temperature of the second reaction step ensures elemental species from the base or substrate surface to be inactive, avoiding formation of undesirable metallic selenide phases such as iron, chromium selenides. This way, two-step process of the present invention can produce CIGS absorber layers with high desirable photovoltaic properties. The method provides a high quality CIGS compound semiconductor absorber layer while maintaining minimal interference from the substrate.

One of the main benefits of the two-step reaction process of present invention is its ability to incorporate Ga into the final absorber film. When a single step reaction process is used at relatively low temperatures (below about 525° C.), a severe Ga segregation is usually observed. The microstructure of such films typically comprises a large-grain top surface region which is In-rich and a small-grain bottom region near the substrate that is Ga-rich. It is understandable that a junction made on this Ga-free surface would yield a device with limited open circuit voltage value as expected from a CIS absorber. When reaction temperature is increased above 525° C. in a single step reaction process, Ga can be incorporated to the absorber film without much segregation. However, if the duration of the reaction at high temperature is too long, severe defectivity is expected due to the substrate effects. CIGS layers produced by the two step process descried in this invention in contrast provides the ability to produce a large grain structure that extends from top to bottom of the film with a relatively uniform Ga distribution. Due to the short time spent at high temperature regime of the first reaction step, deleterious substrate effects are minimized. The advantages of the invention will be further explained with the help of the following example.

EXAMPLE 1

The CIGS precursor film was plated in roll-to-roll fashion over the Molybdenum-containing back contact on stainless steel foil. The precursor film had a Cu/(Ga+In) ratio in the range of 0.75 to 0.95 and a Ga/(Ga+In) ratio in the range of 0.35-055. The precursor film contained excess Se with a Se/(Cu+In+Ga) ratio in the range of 3 to 4. Samples for reaction experiments were cut from the roll-plated foil with an area of approximately 130 cm$^2$. The reaction experiments were carried out in a batch reactor. In these experiments, first set of samples were used in single step experiments, where the temperature was kept constant at 500° C. for 20 minutes during the entire reaction process. Second set of samples were crystallized using the two-step reaction process of the present invention. The samples were first annealed at 620° C. for 5 minutes. At the end of the first step, the vaporized selenium is emptied out of reactor by introducing inert nitrogen gas to the chamber. In the second step reaction temperature is reduced to 500° C. and reaction is continued for 20 minutes. Performance data for the solar cells were collected from current-voltage (J-V) measurements to compare the two-step reaction process of the present invention with the single step reaction carried out 500° C. for 20 minutes. The results from J-V measurement showed about 9% increase in the conversion efficiency of cell prepared using two-step reaction process compared to the single step reaction process. The high conversion efficiencies obtained with the two-step reaction was mainly due to the increases in the open circuit potential of the solar cells, which indicated more Ga was incorporated into the absorber with this technique.

EXAMPLE 2

The same CIGS precursor film, which was plated in roll-to-roll fashion over the Molybdenum-containing back contact on stainless steel foil was used for reaction experiments, which were carried out in a batch reactor using the 130 cm$^2$ samples cut from the roll. In this case, first set of samples were used in single step experiments, where the temperature was kept constant at a higher temperature of 580° C. for 20 minutes during the entire reaction process. Second set of samples were crystallized using the two-step reaction process of the present invention. The samples were first annealed at 620° C. for 5 minutes. At the end of the first step, the vaporized selenium is emptied out of reactor by introducing inert nitrogen gas to the chamber. In the second step reaction temperature is reduced to 500° C. and reaction is continued for 20 minutes. Performance data for the solar cells were collected from current-voltage (J-V) measurements to compare the two-step reaction process of the present invention with the single step reaction carried out 580° C. for 20 minutes. The results from J-V measurement showed about 11% increase in the conversion efficiency of cell prepared using two-step reaction process compared to the single step reaction process. These results also clearly showed that the cells prepared at high temperature reaction for long duration degraded and caused shunts which lowered the solar cell performance. The growth and nucleation mechanism of CIGS thin films is very sensitive to both the temperature and the vapor pressure of Se. The deleterious diffusion of substrate constituents such as Fe, Cr into the CIGS during the reaction might results in formation of undesirable phases such as iron and chromium selenide. It was verified that shunting was reduced for the cells prepared with the two-step process. It is clear from the experimental results that the reaction between Se-vapor and substrate surface is minimal in the two-step process as Se is exhausted out at the end of first step and the reaction is carried out in an inert environment in the second step.

The examples above illustrates that it is possible to obtain absorber layers with a higher quality and a lower amount of bulk and interface defects using the two-step reaction process of the present invention. The drawbacks of a single step process described above can be alleviated using the approaches developed in this invention using a two-step crystallization process.

Although the present invention is described with respect to certain preferred embodiments, modifications thereto will be apparent to those skilled in the art.

We claim:

1. A method of forming a Group IBIIIAVIA absorber layer for manufacturing photovoltaic cells, comprising:
   providing a workpiece having a precursor layer formed over a substrate, the precursor layer including copper, indium, gallium, selenium and a sodium dopant;
   heating the precursor layer to a first temperature;
   reacting the precursor layer in selenium vapor at the first temperature for a first predetermined time to transform the precursor layer to a partially formed absorber structure;
   removing the selenium vapor after the step of reacting the precursor layer at the first temperature;
   cooling down the partially formed absorber structure to a second temperature, wherein the first temperature and the second temperature are each above 400° C., and the first temperature is greater than the second temperature; and
   reacting the partially formed absorber structure in an inert gas atmosphere at the second temperature for a second predetermined time, which is longer than the first predetermined time, to form a Group IBIIIAVIA absorber layer.

2. The method of claim 1, wherein the first temperature is above 620° C.

3. The method of claim 2, wherein the second temperature is in the range of 450-525° C.

4. The method of claim 3, wherein the first predetermined time is in the range of 2-7 minutes and the second predetermined time is in the range of 15-25 minutes.

5. The method of claim 4, wherein the step of heating includes a ramp rate of at least 5° C./second.

6. The method of claim 1, wherein the method of forming the Group IBIIIAVIA absorber layer is performed in a roll to roll reactor.

7. The method of claim 6, wherein the step of providing comprises advancing the workpiece into the roll to roll reactor through an entrance opening.

8. The method of claim 7, wherein the workpiece is released from a supply spool adjacent the entrance opening by unwrapping the workpiece from the supply spool before the step of providing.

9. The method of claim 8, wherein the workpiece is received from an exit opening of the roll to roll reactor and wrapped around a receiving spool adjacent the entrance opening after the step of reacting the partially formed absorber structure.

10. The method of claim 1, wherein the step of reacting the precursor layer at the second temperature is carried out in an inert gas atmosphere.

11. The method of claim 1, wherein the first temperature is in the range of 525-650° C. and the second temperature is in the range of 450-525° C.

12. The method of claim 11, wherein the first predetermined time is in the range of 2-7 minutes and the second predetermined time is in the range of 15-25 minutes.

13. The method of claim 1, wherein the step of heating includes a ramp rate of at least 5° C./second.

* * * * *